US011989066B2

United States Patent
Fu et al.

(10) Patent No.: US 11,989,066 B2
(45) Date of Patent: May 21, 2024

(54) SYSTEM AND METHOD OF MANAGING MONITORING SIGNALS ASSOCIATED WITH FANS OF INFORMATION HANDLING SYSTEMS

(71) Applicant: Dell Products L.P., Round Rock, TX (US)

(72) Inventors: Chi-Chang Fu, Taipei (TW); Feng Cheng Su, Taoyuan (TW); Chen Chi Hsieh, Taipei (TW)

(73) Assignee: Dell Products L.P., Round Rock, TX (US)

( * ) Notice: Subject to any disclaimer, the term of this patent is extended or adjusted under 35 U.S.C. 154(b) by 358 days.

(21) Appl. No.: 17/648,637

(22) Filed: Jan. 21, 2022

(65) Prior Publication Data
US 2023/0236645 A1 Jul. 27, 2023

(51) Int. Cl.
- *G06F 1/20* (2006.01)
- *H03F 3/16* (2006.01)
- *H05K 7/20* (2006.01)

(52) U.S. Cl.
CPC ............. *G06F 1/20* (2013.01); *H03F 3/16* (2013.01); *H05K 7/20172* (2013.01); *H05K 7/20209* (2013.01)

(58) Field of Classification Search
CPC ....................................................... G06F 1/20
See application file for complete search history.

(56) References Cited

U.S. PATENT DOCUMENTS

| | | | | |
|---|---|---|---|---|
| 5,727,928 A | * | 3/1998 | Brown | F04D 27/008 361/679.48 |
| 2003/0053913 A1 | * | 3/2003 | Sekiguchi | F04D 25/166 417/3 |
| 2011/0089880 A1 | * | 4/2011 | Huang | F04D 27/004 318/472 |

* cited by examiner

*Primary Examiner* — Paul B Yanchus, III
(74) *Attorney, Agent, or Firm* — McDermott Will & Emery LLP

(57) ABSTRACT

In one or more embodiments, a fan circuit may be configured with an input of a first amplifier coupled to a revolution indicator associated with a fan; an output of the first amplifier coupled to an input of a second amplifier; and a power supply input of the second amplifier coupled to a first contact of a first connector. In one or more embodiments, the first contact of the first connector may be coupled to a first contact of a second connector to drive a resistive load coupled to the first contact of the second connector; a second contact of the first connector may be coupled to a second contact of the second connector to provide a reference voltage to the second amplifier; and the second amplifier may provide amplified signals to the first contact of the first connector based at least on signals received from the revolution indicator.

20 Claims, 9 Drawing Sheets

SYSTEM AND METHOD OF MANAGING MONITORING SIGNALS ASSOCIATED WITH FANS OF INFORMATION HANDLING SYSTEMS

BACKGROUND

Field of the Disclosure

This disclosure relates generally to information handling systems and more particularly to managing monitoring signals associated with fans of information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, an information handling system may include one or more fan modules. For example, a fan module may include a fan, a revolution indicator, and a fan circuit communicatively coupled to the revolution indicator. For instance, the fan circuit may include multiple amplifiers and multiple resistors. In one or more embodiments, an input of a first amplifier of the multiple amplifiers may be coupled to a first resistor of the multiple resistors and the revolution indicator associated with the fan. For example, the first resistor may be coupled to a positive voltage reference. In one or more embodiments, an output of the first amplifier may be coupled to an input of a second amplifier of the multiple amplifiers and a second resistor of the multiple resistors. For example, a power supply input of the second amplifier may be coupled to a first contact of a first connector and an output of the second amplifier may be coupled to a second contact of the first connector.

In one or more embodiments, the first contact of the first connector may be configured to be coupled to a first contact of a second connector to drive a resistive load coupled to the first contact of the second connector. For example, the second contact of the first connector may be configured to be coupled to a second contact of the second connector to provide a reference voltage to the second amplifier. In one or more embodiments, the second amplifier may be configured to provide amplified signals, with reference to a voltage associated with the second contact of the first connector, to the first contact of the first connector based at least on signals received via the input of the second amplifier. In one or more embodiments, the first amplifier may be configured to invert signals from the revolution indicator. For example, the second amplifier is configured to invert signals from the first amplifier.

In one or more embodiments, signals from the revolution indicator may indicate complete revolutions of the fan or multiple portions of the complete revolutions of the fan. In one or more embodiments, the first amplifier may include a first transistor and the second amplifier may include a second transistor. For example, the first transistor may include a first bipolar junction transistor or a first field-effect transistor, and the second transistor may include a second bipolar junction transistor or a second field-effect transistor. For instance, the first field-effect transistor may include a first metal-oxide-semiconductor field effect transistor or a first junction field effect transistor, and the second field-effect transistor may include a second metal-oxide-semiconductor field-effect transistor or a second junction field-effect transistor.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1A:
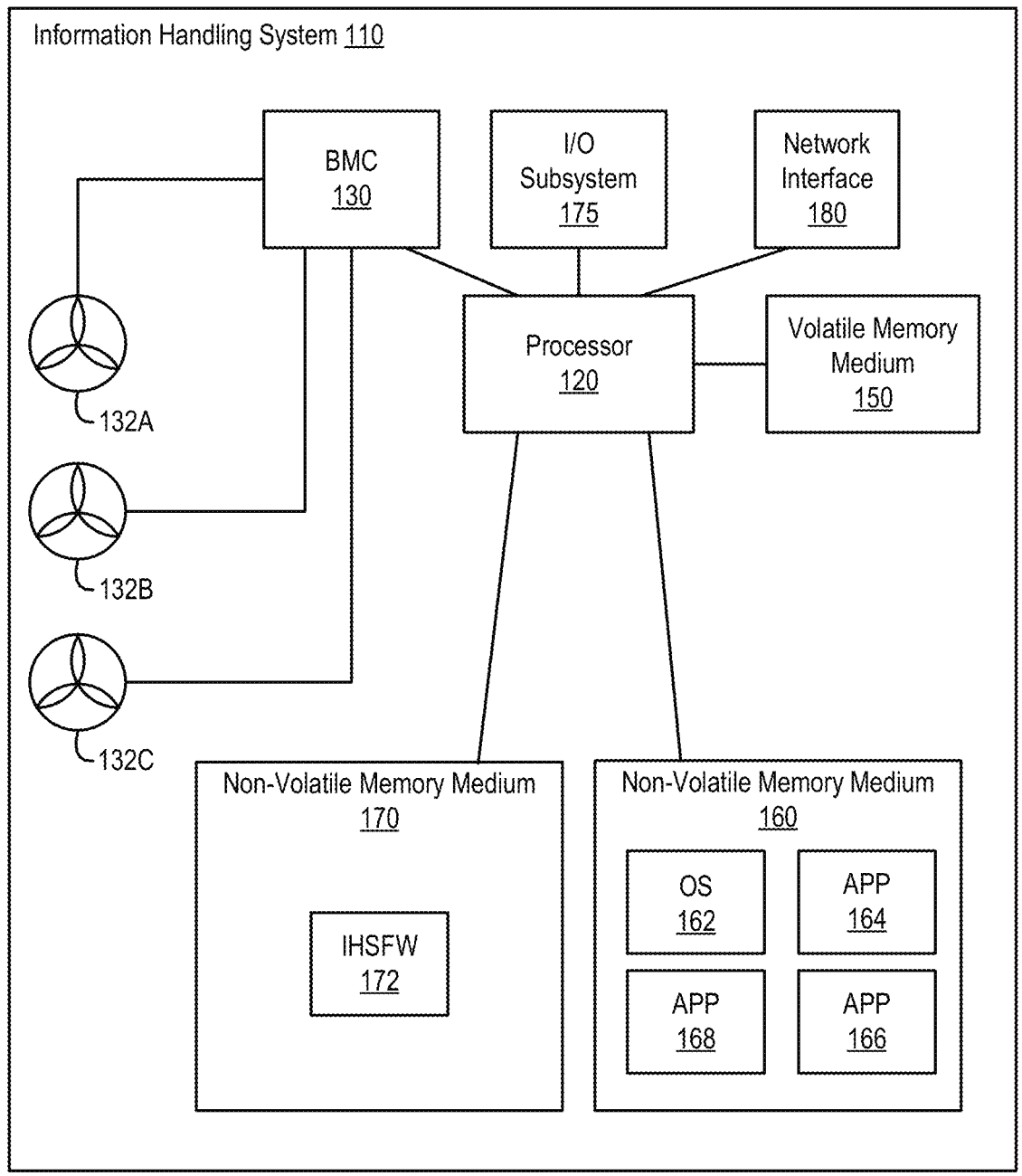
FIG. 1A illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, a fan circuit may incur fan reading errors after being utilized for a period of time. In one example, when a fan of an information handling system is utilized for a second period of time, longer than the period of time, more fan reading errors may be incurred. In another example, if a first fan provides more airflow than a second fan per time period, the fan circuit may incur fan more reading errors associated with the first fan than the second fan. In one instance, the first fan may draw more current than the second fan. In another instance, the first fan may be associated with greater vibrations than the second fan.

In one or more embodiments, vibrations associated with the first fan may generate and/or induce greater contact resistance than the second fan. For example, the vibrations associated with the first fan may generate and/or induce fretting and/or pitting of contacts associated with the first fan. For instance, the fretting and/or pitting of the contacts associated with the first fan may reduce one or more areas of physical contact.

In one or more embodiments, a fan may be coupled to a component of an information handling system via multiple contacts (e.g., multiple conductors). In one example, the fan may include a first connector that includes a first portion of the multiple contacts. In another example, the component of the information handling system may include a second connector that includes a second portion of the multiple contacts. For instance, the first portion of the multiple contacts and the second portion of the multiple contacts may not be soldered. As an example, each of the first portion of the multiple contacts may be coupled to a respective one of the second portion of the multiple conductors via pressure. In one or more embodiments, the component of the information handling system may include a printed circuit board (PCB). For example, the PCB may be or may include a motherboard of the information handling system.

In one or more embodiments, as the fan is utilized, the fan may generate vibrations that may cause each of the first portion of the multiple contacts to rub, abrade, and/or wear against a respective one of the second portion of the multiple contacts. For example, when a first contact of the first portion of the multiple contacts rubs, abrades, and/or wears against a second contact of the second portion of the multiple contacts, one or more of the first contact and the second contact may erode, fret, and/or pit. For instance, eroding, fretting, and/or pitting of the one or more of the first contact and the second contact may cause a resistance between the first contact and the second contact to increase. As an example, if resistance between the first contact and the second contact increases, power may be lost between the first contact and the second contact. As a second example, if resistance between the first contact and the second contact increases, communications that utilize the first contact and the second contact may be degraded, erroneous, and/or lost. As another example, if resistance between the first contact and the second contact increases, a ground bounce may occur between the first contact and the second contact. In one or more embodiments, a high power fan may create a larger ground bounce in a fan circuit, which may generate invalid or erroneous waveform associated with signals from a revolution indicator associated with the high power fan.

In one or more embodiments, a ground bounce may include a deviation of a reference voltage value. For example, the reference voltage value may be zero volts (0V), but other reference voltage values may be utilized. For instance, a ground bounce may interfere with communications. As an example, a ground bounce may cause a fan reading error. In one or more embodiments, a deviation of a reference voltage value may increase from zero volts (0V) to a positive voltage value. For example, a first voltage value may associated with zero volts (0V), which may indicate a zero (0) in digital communications, and a second voltage value may associated with a positive voltage threshold value, which may indicate a one (1) in digital communications. For instance, if the deviation of the reference voltage value increases to the positive voltage threshold value, a communications error may occur. As an example, if the deviation of the reference voltage value increases to the positive voltage threshold value, digital communications may cease to function and/or operate since all communicated values would be one (1).

Turning now to FIG. 1A, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit (I²C) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, a baseboard management controller (BMC) 130, a volatile memory medium 150, non-volatile memory media 160 and 170, an I/O subsystem 175, and a network interface 180. As illustrated, BMC 130, volatile memory medium 150, non-volatile memory media 160 and 170, I/O subsystem 175, and network interface 180 may be communicatively coupled to processor 120.

In one or more embodiments, one or more of BMC 130, volatile memory medium 150, non-volatile memory media 160 and 170, I/O subsystem 175, and network interface 180 may be communicatively coupled to processor 120 via one or more buses, one or more switches, and/or one or more root complexes, among others. In one example, one or more of BMC 130, volatile memory medium 150, non-volatile memory media 160 and 170, I/O subsystem 175, and network interface 180 may be communicatively coupled to processor 120 via one or more PCI-Express (PCIe) root complexes. In another example, one or more of BMC 130, I/O subsystem 175 and network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing at least a portion of one or more systems, at least a portion of one or more flowcharts, at least a portion of one or more methods, and/or at least a portion of one or more processes described herein. In one example, processor 120 may execute processor instructions from one or more of memory media 150, 160, and 170 in implementing at least a portion of one or more systems, at least a portion of one or more flowcharts, at least a portion of one or more methods, and/or at least a portion of one or more processes described herein. In another example, processor 120 may execute processor instructions via network interface 180 in implementing at least a portion of one or more systems, at least a portion of one or more flowcharts, at least a portion of one or more methods, and/or at least a portion of one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150, 160, and 170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, OS 162 may include a management information exchange. In one example, the management information exchange may permit multiple components to exchange management information associated with managed elements and/or may permit control and/or management of the managed elements. In another example, the management information exchange may include a driver and/or a driver model that may provide an OS interface through which managed elements (e.g., elements of IHS 110) may provide information and/or notifications, among others. In one instance, the management information exchange may be or include a Windows Management Interface (WMI) for ACPI (available from Microsoft Corporation). In another instance, the management information exchange may be or include a Common Information Model (CIM) (available via the Distributed Management Task Force). In one or more embodiments, the management information exchange may include a combination of the WMI and the CIM. For example, WMI may be and/or may be utilized as an interface to the CIM. For instance, the WMI may be utilized to provide and/or send CIM object information to OS 162.

In one or more embodiments, processor 120 and one or more components of IHS 110 may be included in a system-on-chip (SoC). For example, the SoC may include processor 120 and a platform controller hub (not specifically illustrated).

In one or more embodiments, BMC 130 may be or include a remote access controller. For example, the remote access controller may be or include a DELL™ Remote Access Controller (DRAC). In one or more embodiments, a remote access controller may be integrated into IHS 110. For example, the remote access controller may be or include an integrated DELL™ Remote Access Controller (iDRAC). In one or more embodiments, a remote access controller may include one or more of a processor, a memory, and a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. In one example, the remote access controller may be based at least on an Intelligent Platform Management Interface (IPMI) standard. For instance, the remote access controller may allow and/or permit utilization of IPMI out-of-band interfaces such as IPMI Over LAN (local area network). In another example, the remote access controller may be based at least on a Redfish standard. In one instance, one or more portions of the remote access controller may be compliant with one or more portions of a Redfish standard. In another instance, one or more portions of the remote access controller may implement one or more portions of a Redfish standard. In one or more embodiments, a remote access controller may include and/or provide one or more internal private networks. For example, the remote access controller may include and/or provide one or more of an Ethernet interface, a front panel USB interface, and a Wi-Fi interface, among others. In one or more embodiments, a remote access controller may be, include, or form at least a portion of a virtual KVM (keyboard, video, and mouse) device. For example, a remote access controller may be, include, or form at least a portion of a KVM over IP (IPKVM) device. For instance, a remote access controller may capture video, keyboard, and/or mouse signals; may convert the signals into packets; and may provide the packets to a remote console application via a network.

In one or more embodiments, BMC 130 may be or include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, BMC 130 may be or include an application processor. In one example, BMC 130 may be or include an ARM Cortex-A processor. In another example, BMC 130 may be or include an Intel Atom processor. In one or more embodiments, BMC 130 may be or include one or more of a field programmable gate array (FPGA) and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

In one or more embodiments, IHS 110 may include one or more fans. For example, information handling system 110 may include fans 132A-132C. For instance, a fan 132 may be configured to move air through at least a portion of IHS 110 and/or may be configured to remove heat from at least a portion of IHS 110. In one or more embodiments, a fan 132 may move air in a direction associated with a longitudinal axis of fan 132. Although IHS 110 is illustrated as including fans 132A-132C, IHS 110 may include any number of fans 132, according to one or more embodiments. In one or more embodiments, BMC 130 may control one or more of fans 132A-132C. For example, BMC 130 may provide control information to a fan controller (not specifically illustrated), which may control one or more of fans 132A-132C. For instance, BMC 130 may provide control information to the fan controller via a SMBus. In one or more embodiments, a fan 132 may generate one or more sounds as fan 132 operates to move air. For example, the one or more sounds the fan 132 generates may be quantified as one or more sound pressure levels. In one or more embodiments, a fan 132 may generate one or more vibrations as fan 132 operates to move air. In one or more embodiments, BMC 130 may be communicatively coupled to one or more of fans 132A-132C, among others. For example, BMC 130 may control one or more of fans 132A-132C. For instance, BMC 130 may control one or more speeds of one or more of fans 132A-132C. In one or more embodiments, BMC 130 may be communicatively coupled to one or more fan modules.

Figure 1B:
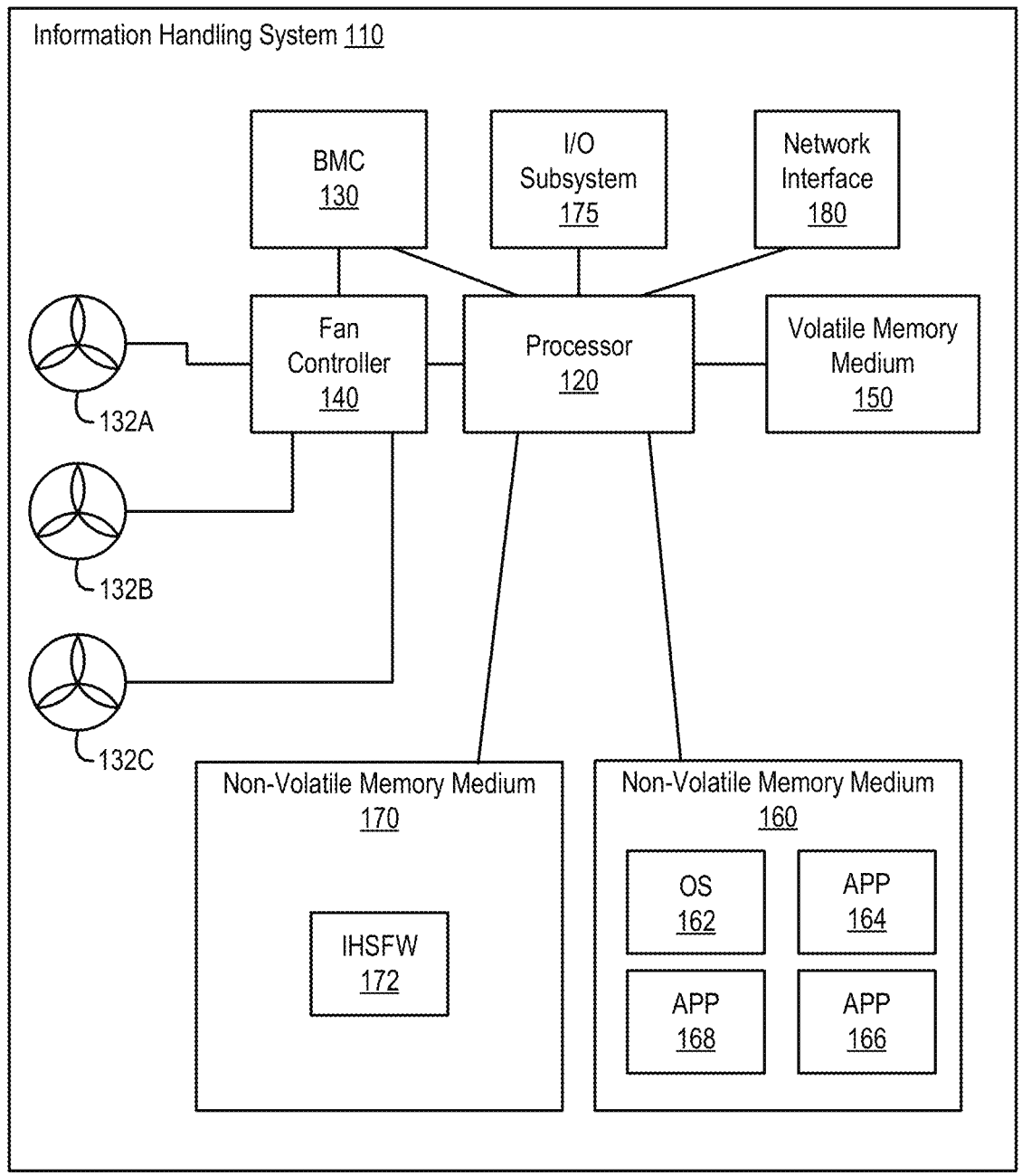
FIG. 1B a second example of an information handling system, according to one or more embodiments.

Turning now to FIG. 1B, a second example of an information handling system is illustrated, according to one or more embodiments. In one or more embodiments, IHS 110 may include a fan controller 140. For example, fan controller 140 may be communicatively coupled to one or more of processor 120 and BMC 130, among others. In one or more embodiments, fan controller 140 may be communicatively coupled to one or more of fans 132A-132C, among others. For example, fan controller 140 may control one or more of fans 132A-132C. For instance, fan controller 140 may control one or more speeds of one or more of fans 132A-132C. In one or more embodiments, fan controller 140 may be communicatively coupled to one or more fan modules.

In one or more embodiments, fan controller 140 may be or include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, fan controller 140 may be or include one or more of a FPGA and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

Figure 1C:
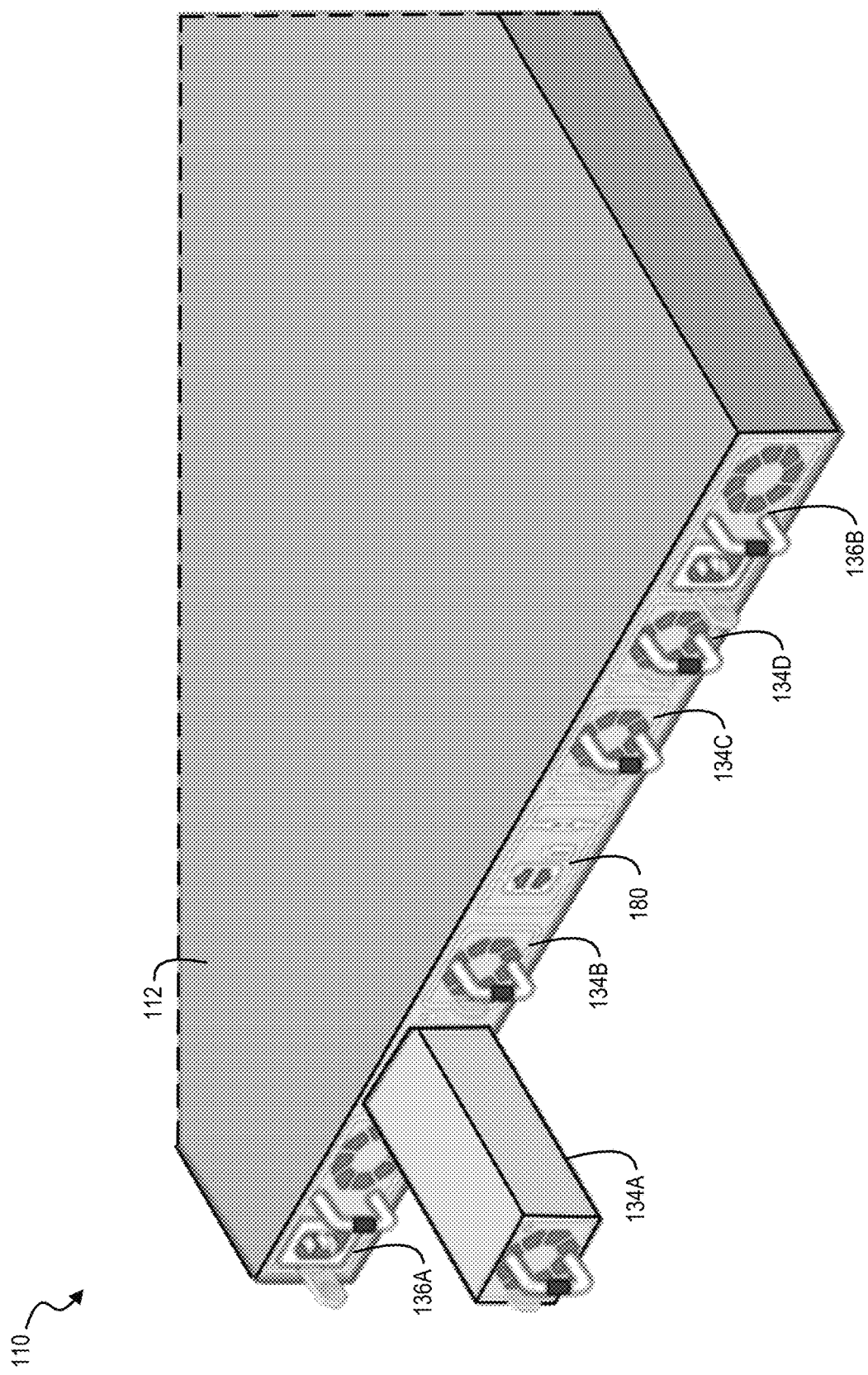
FIG. 1C another example of an information handling system, according to one or more embodiments.

Turning now to FIG. 1C, another example of an information handling system is illustrated, according to one or more embodiments. In one or more embodiments, IHS 110 may include a chassis 112. For example, chassis 112 may house IHS 110. For instance, chassis 112 may be or may include a housing of IHS 110. In one or more embodiments, a fan module 134 may be mounted in chassis 112. For example, fan modules 134A-134D may be mounted in chassis 112. In one or more embodiments, a fan module 134 may include a chassis. For example, the chassis may house components of fan 134. In one or more embodiments, a fan module 134 may include a fan 132. In one or more embodiments, a fan module 134 may be installed in and/or may be removed from chassis 112. For example, a first fan module 134 may be swapped out with a second fan module 134. For instance, a first fan module 134 may be hot-swapped out with a second fan module 134.

In one or more embodiments, a power supply 136 may be mounted in chassis 112. For example, power supplies 136A and 136B may be mounted in chassis 112. In one or more embodiments, a power supply 136 may provide power to one or more components of IHS 110. In one or more embodiments, a power supply 136 may be installed in and/or may be removed from chassis 112. For example, a first power supply 136 may be swapped out with a second power supply 136. For instance, a power supply 136 may be hot-swapped out with a second power supply 136.

Figure 2A:
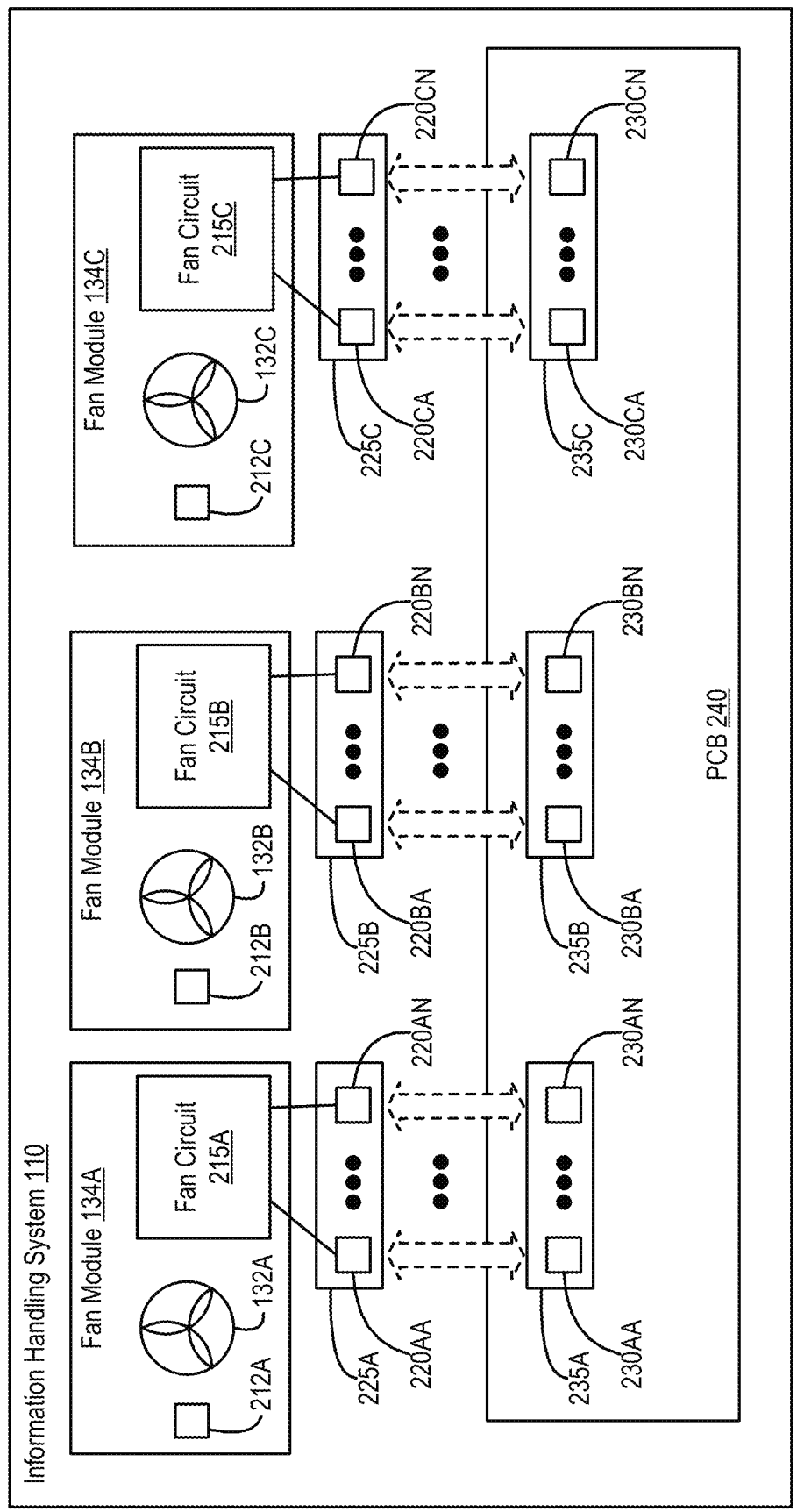
FIG. 2A illustrates an example of an information handling system that include fan modules, according to one or more embodiments.

Turning now to FIG. 2A, an example of an information handling system that include fan modules is illustrated, according to one or more embodiments. In one or more embodiments, IHS 110 may include one or more fan modules. For example, IHS 110 may include fan modules 134A-134C. Although IHS 110 is illustrated as including fan modules 134A-134C, IHS 110 may include any number of fan modules 134, according to one or more embodiments. In one or more embodiments, a fan module 134 may include a fan 132. For example, fan modules 134A-134C may include fans 132A-132C, respectively. In one or more embodiments, fan module 134 may include a revolution indicator 212. For example, fan modules 134A-134C may include revolution indicator 212A-212C, respectively. In one or more embodiments, a fan module 134 may include a fan circuit 215. For example, fan modules 134A-134C may include fan circuits 215A-215C, respectively.

In one or more embodiments, a revolution indicator 212 may provide signals that may indicate complete revolutions of a fan 132 or multiple portions of complete revolutions of fan 132. For example, a revolution indicator 212 may provide signals, which may indicate complete revolutions of a fan 132 or multiple portions of complete revolutions of a fan 132, to a fan circuit 215. In one instance, a revolution indicator 212 may be communicatively coupled to a fan circuit 215. In another instance, a fan circuit 215 may include a revolution indicator 212. In one or more embodiments, a revolution indicator 212 may be or may include a tachometer. For example, a revolution indicator 212 may be or may include an instrument that may measure or may be utilized to measure a rotation speed of a shaft, a fan, or a disk, among others.

In one or more embodiments, a fan circuit 215 may be coupled to contacts 220. In one example, fan circuit 215A may be coupled to contacts 220AA-220AN. In a second example, fan circuit 215B may be coupled to contacts 220BA-220BN. In another example, fan circuit 215C may be coupled to contacts 220CA-220CN. In one or more embodiments, a connector 225 may include contacts 220. In one example, a connector 225A may include contacts 220AA-220AN. For instance, connector 225A may house contacts 220AA-220AN. In a second example, a connector 225B may include contacts 220BA-220BN. For instance, connector 225B may house contacts 220BA-220BN. In another example, a connector 225C may include contacts 220CA-220CN. For instance, connector 225C may house contacts 220CA-220CN. Although not specifically illustrated, a fan module 134 may include a connector 225, according to one or more embodiments. In one example, fan module 134A may include connector 225A. In a second example, fan module 134B may include connector 225B. In another example, fan module 134C may include connector 225C.

In one or more embodiments, a contact 220 may be coupled to a contact 230. In one example, contacts 220AA-220AN may be coupled to contacts 230AA-2AN. In a second example, contacts 220BA-220BN may be coupled to contacts 230BA-230BN. In another example, contacts 220CA-220CN may be coupled to contacts 230CA-230CN. In one or more embodiments, a connector 235 may include contacts 230. In one example, a connector 235A may include contacts 230AA-230AN. For instance, connector 235A may house contacts 230AA-230AN. In a second example, a connector 235B may include contacts 230BA-230BN. For instance, connector 235B may house contacts 230BA-230BN. In another example, connector 235C may include contacts 230CA-230CN. For instance, connector 235C may house contacts 230CA-230CN.

In one or more embodiments, a contact 230 may be coupled to a PCB 240. In one example, PCB 240 may couple a contact 230 to BMC 130. For instance, PCB 240 may couple contacts 230AA-230AN, 230BA-230BN, and 230CA-230CN to BMC 130. In another example, PCB 240 may couple a contact 230 to fan controller 140. For instance, PCB 240 may couple contacts 230AA-230AN, 230BA-230BN, and 230CA-230CN to fan controller 140. In one or more embodiments, IHS 110 may include PCB 240. For example, PCB 240 may be or include a motherboard of IHS 110. In one or more embodiments, a connector 220 may be connected to a connector 230. For example, when a connector 220 is connected to a connector 230, contacts 220 of connector 225 may be coupled to respective contacts 230 of connector 235.

In one or more embodiments, fan circuit 215 may be or include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. For instance, the microcontroller may be configured, coded, and/or encoded with instructions in accordance with at least a portion of one or more of systems, at least a portion of one or more flowcharts, at least a portion of one or more methods, and/or at least a portion of one or more processes described herein. In one or more embodiments, fan circuit 215 may be or include one or more of a FPGA and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

In one or more embodiments, a fan circuit 215 may receive control information from one or more of BMC 130 and fan controller 140. For example, fan circuit 215 may control an associated fan 132 based at least on the control information. In one or more embodiments, a fan circuit 215 may provide performance information to one or more of BMC 130 and fan controller 140. For example, the performance information may indicate a portion of a revolution of a fan 132 or a revolution of a fan 132.

Figure 2B:
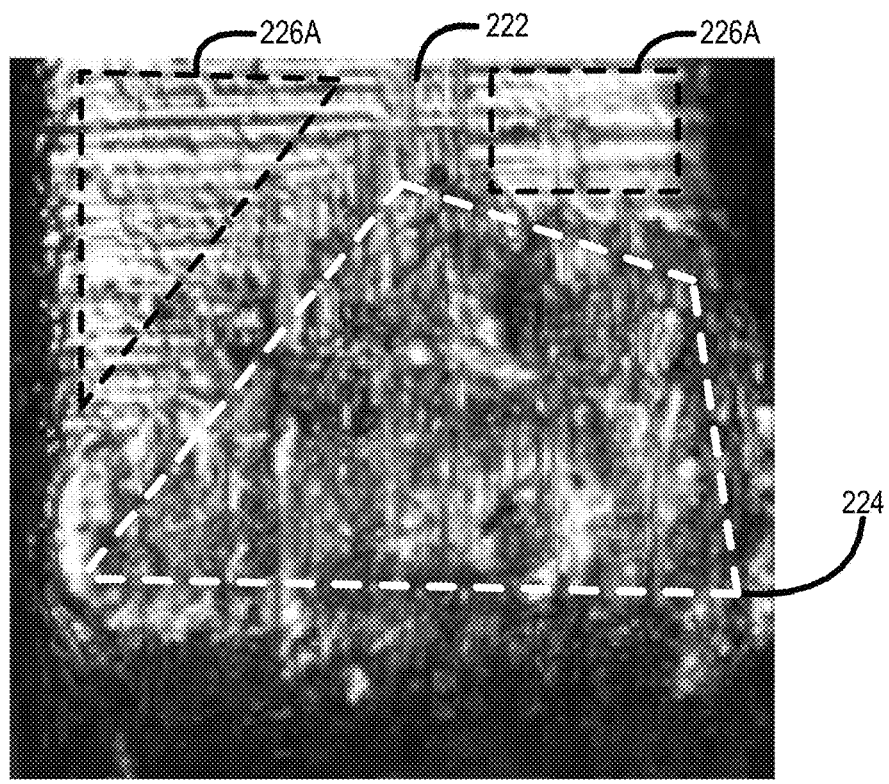
FIG. 2B illustrates an example of a worn contact, according to one or more embodiments.

Turning now to FIG. 2B, an example of a worn contact is illustrated, according to one or more embodiments. In one or more embodiments, as a fan 132 is utilized, fan 132 may generate vibrations that may cause a contact 220 to rub, abrade, and/or wear against a respective contact 230. For example, when a contact rubs, abrades, and/or wears against another contact, one or more of the contact and the other contact may erode, fret, and/or pit. For instance, eroding, fretting, and/or pitting of the one or more of the contact and the other contact may cause a resistance between the contact and the other contact to increase.

As illustrated, a contact 222 may include a portion 224 that is worn. For example, portion 224 of contact 222 may be eroded, fretted, and/or pitted. In one instance, contact 222 may be a contact 220. In another instance, contact 222 may be a contact 230. In one or more embodiments, portion 224 of contact 222 may cause a contact resistance to increase, compared to a state of portion 224 when portion 224 was not worn. As shown, contact 222 may include one or more portions 226A and 226B that are not worn. For example, the one or more portions 226A and 226B of contact 222 may not be eroded, fretted, and/or pitted.

Figure 2C:
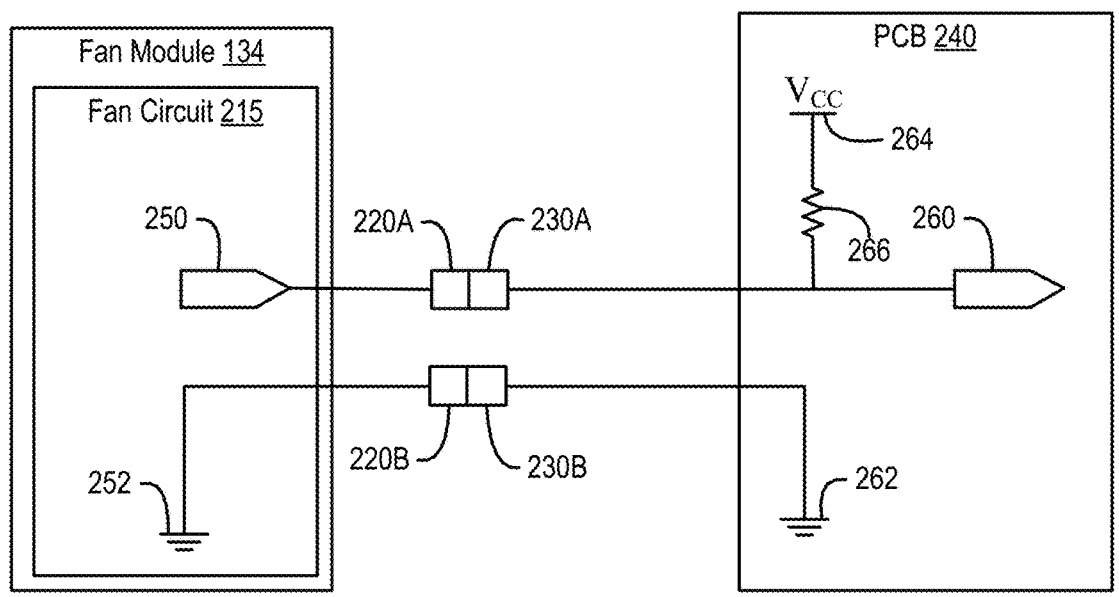
FIG. 2C illustrates an example of a fan module and a printed circuit board, according to one or more embodiments.

Turning now to FIG. 2C, an example of a fan module and a printed circuit board is illustrated, according to one or more embodiments. In one or more embodiments, a fan module 134 may include a fan circuit 215. For example, a pin 250 may receive signals from a revolution indicator 212 associated with a fan 132. For instance, example signals 280 from revolution indicator 212 at pin 250 are shown in FIG. 2E. In one or more embodiments, the signals from revolution indicator 212 may indicate complete revolutions of fan 132 or multiple portions of complete revolutions of fan 132. In one or more embodiments, fan module 134 may include revolution indicator 212 associated with fan 132.

In one or more embodiments, fan circuit 215 may include a voltage reference 252. For example, voltage reference 252 may be a ground or a ground reference. For instance, voltage reference 252 may be a chassis ground of IHS 110. In one or more embodiments, pin 250 may be coupled to a contact 220A. For example, contact 220A may be coupled to a contact 230A. For instance, contact 220A may be coupled to contact 230A via pressure. As an example, contact 220A may not be soldered or welded to contact 230A. In one or more embodiments, voltage reference 252 may be coupled to a contact 220B. For example, contact 220B may be coupled to a contact 230B. For instance, contact 220B may be coupled to contact 230B via pressure. As an example, contact 220B may not be soldered or welded to contact 230B.

In one or more embodiments, one or more of contacts 220 and 230 may wear, which may cause a contact resistance between contacts 220 and 230 to increase. For example, one or more of contacts 220 and 230 may wear from vibrations from fan 132. In one or more embodiments, contact 230A may be coupled to a pin 260. For example, a PCB 240 may include pin 260. In one instance, pin 260 may be coupled to BMC 130. In another instance, pin 260 may be coupled to fan controller 140. In one or more embodiments, contact 230A may be coupled to a resistor 266.

For example, PCB 240 may include resistor 266. In one or more embodiments, resistor 266 may be coupled to a positive voltage reference or a positive voltage supply 264. For example, the positive voltage reference or the positive voltage supply may be $V_{CC}$. For instance, resistor 266 may be a pull-up resistor.

In one or more embodiments, PCB 240 may include a voltage reference 262. For example, voltage reference 262 may be a ground or a ground reference. For instance, voltage reference 262 may be a chassis ground of IHS 110. In one or more embodiments, signals from fan circuit 215 may be at pin 260. For example, as contact resistance increases between contacts 220B and 230B, signals from fan circuit 215 may be degraded at pin 260. For instance, example signals 282 from fan circuit 215 at pin 260 are shown in FIG. 2F.

In one or more embodiments, when a signal 282 at pin 260 is below a voltage threshold of 284, a logical zero may be indicated and/or inferred. For example, when contact resistance increases between conductors 220B and 230B, a signal 282 at pin 260 may not be below or may not be entirely below voltage threshold of 284. For instance, a logical zero may not be indicated and/or inferred when a signal 282 at pin 260 may not be below or may not be entirely below voltage threshold of 284 when signal 282 at pin 260 should be below voltage threshold of 284. In one or more embodiments, when contact resistance increases between contacts 220B and 230B and when a signal 282 at pin 260 is not below or is not entirely below voltage threshold of 284 may be considered a ground bounce. For example, a ground bounce may cause erroneous reading associated with a fan 132.

Figure 2D:
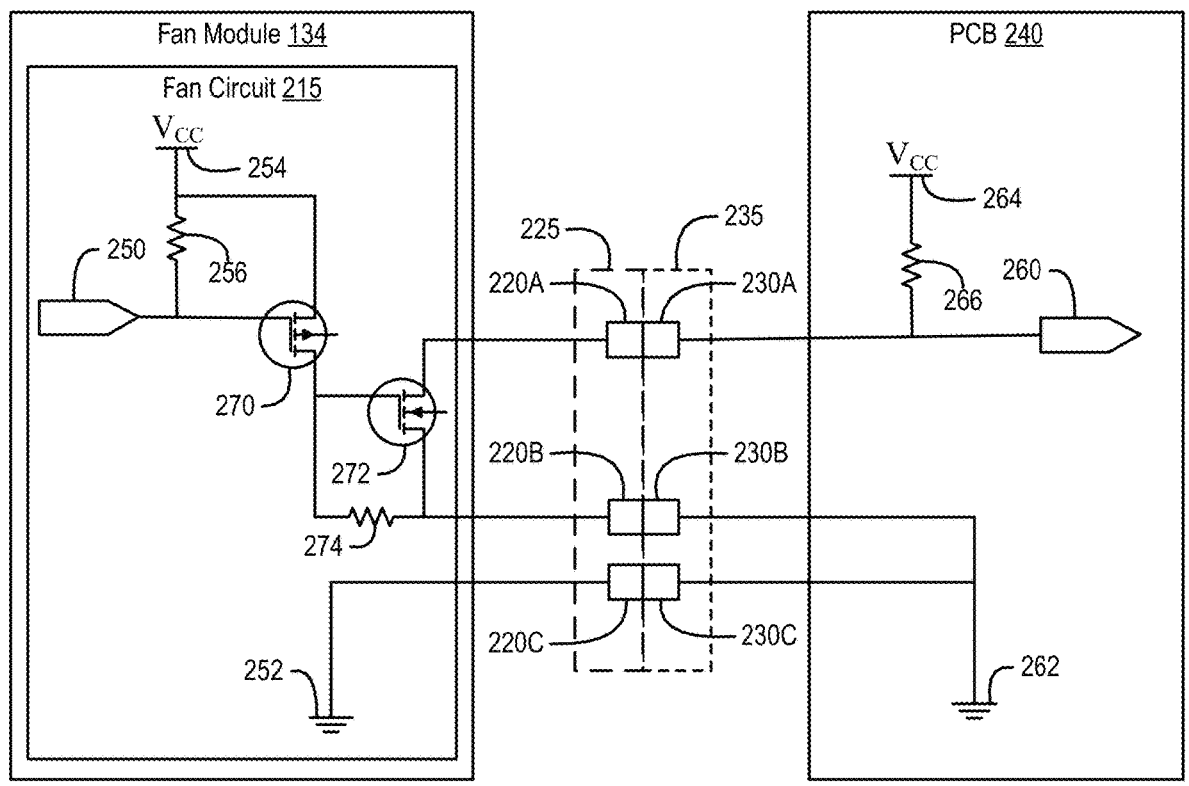
FIG. 2D illustrates another example of a fan module and a printed circuit board, according to one or more embodiments.
Figure 2E:
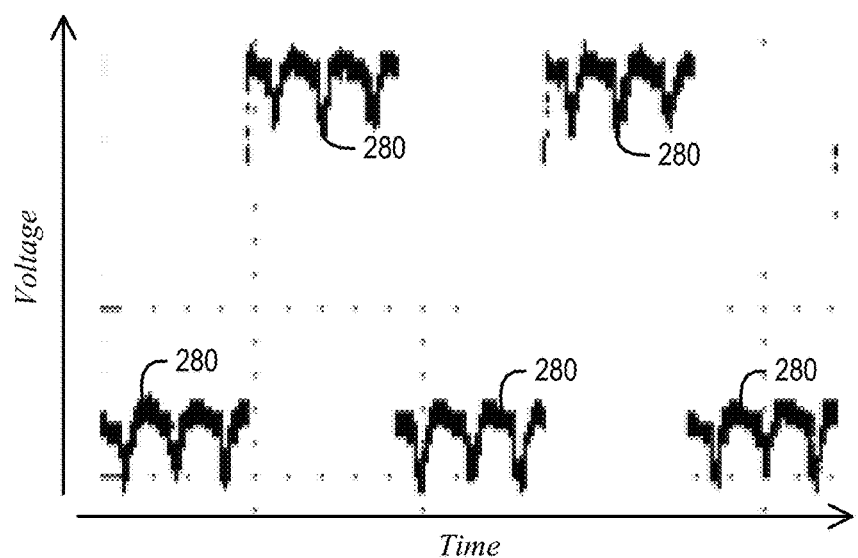
FIG. 2E illustrates example signals from a revolution indicator, according to one or more embodiments.
Figure 2F:
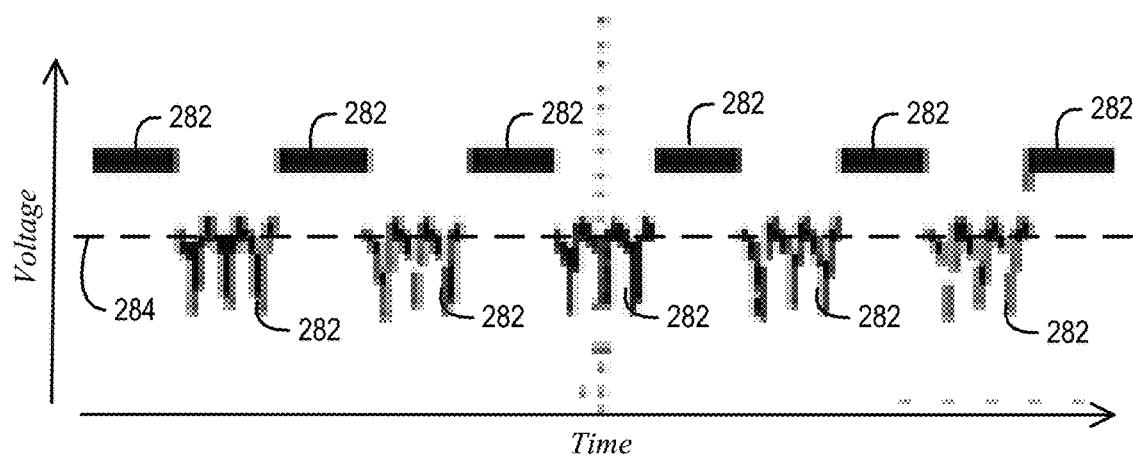
FIG. 2F illustrates example signals from a first fan circuit through at least one worn contact associated with contact resistance, according to one or more embodiments.

Turning now to FIG. 2D, another example of a fan module and a printed circuit board is illustrated, according to one or more embodiments. In one or more embodiments, fan circuit 215 may include a resistor 256. For example, pin 250 may be coupled to resistor 256. For instance, resistor 256 may be coupled to a positive voltage reference or a positive voltage supply 254. As an example, positive voltage 254 may be a positive voltage reference or a positive voltage supply of fan circuit 215. In one or more embodiments, the positive voltage reference or the positive voltage supply may be $V_{CC}$. For example, resistor 256 may be a pull-up resistor.

In one or more embodiments, fan circuit 215 may include a first amplifier. For example, the first amplifier may include a transistor 270. In one or more embodiments, transistor 270 may be a field effect transistor (FET). In one example, transistor 270 may be a junction field effect transistor (JFET). For instance, transistor 270 may be a p-channel JFET. In a second example, transistor 270 may be a metal-oxide-semiconductor field-effect transistor (MOSFET). For instance, transistor 270 may be a p-channel MOSFET. In another example, transistor 270 may be a bipolar junction transistor (BJT). For instance, transistor 270 may be a PNP BJT. In one or more embodiments, the first amplifier may be an inverting amplifier. For example, the first amplifier may be configured to invert signals from revolution indicator 212. In one or more embodiments, the first amplifier may be a non-inverting amplifier. For example, the first amplifier may be configured to not invert signals from revolution indicator 212.

In one or more embodiments, pin 250 may be coupled may be coupled to a signal input of the first amplifier. For example, pin 250 may be coupled may be coupled to a signal input of transistor 270. In one or more embodiments, a power supply input of the first amplifier may be coupled to positive voltage supply 254. For example, a power supply input of transistor 270 may be coupled to positive voltage supply 254.

In one or more embodiments, an output of the first amplifier may be coupled to a signal input of a second amplifier. For example, the second amplifier may include a transistor 272. In one or more embodiments, transistor 272 may be a FET. In one example, transistor 272 may be a JFET. For instance, transistor 272 may be a n-channel JFET. In a second example, transistor 272 may be a MOSFET. For instance, transistor 272 may be a n-channel MOSFET. In another example, transistor 272 may be a BJT. For instance, transistor 272 may be a NPN BJT. In one or more embodiments, the second amplifier may be an inverting amplifier. For example, the second amplifier may be configured to invert signals from the first amplifier. In one or more embodiments, the second amplifier may be a non-inverting amplifier. For example, the second amplifier may be configured to not invert signals from the first amplifier.

In one or more embodiments, a single semiconductor substrate may include the first amplifier and the second amplifier. For example, a single semiconductor substrate may include transistor 270 and transistor 272. For instance, the single semiconductor substrate may include a transistor array, which may include transistor 270 and transistor 272. In one or more embodiments, fan circuit 215 may include the single semiconductor substrate that includes the first amplifier and the second amplifier. In one or more embodiments, a single semiconductor package may include the single semiconductor substrate. For example, a single semiconductor package may include the first amplifier and the second amplifier. For instance, a single semiconductor package may include transistor 270 and transistor 272. In one or more embodiments, the single semiconductor substrate may include one or more resistors. For example, the single semiconductor substrate may include one or more of resistors 256 and 274. In one or more embodiments, one or more of resistors 256 and 274 may be external to the single semiconductor substrate. In one or more embodiments, a single semiconductor package may include one or more resistors. For example, the single semiconductor package may include one or more of resistors 256 and 274. In one or more embodiments, one or more of resistors 256 and 274 may be external to the single semiconductor package.

In one or more embodiments, the output of the first amplifier may be coupled to a resistor 274. For example, resistor 274 may be coupled to an output of the second amplifier. For instance, the output of the second amplifier may be coupled to contact 220B. In one or more embodiments, contact 220B may be coupled to contact 230B. For example, contact 220B may be coupled to contact 230B via pressure. For instance, contact 220B may not be soldered or welded to a contact 230B. In one or more embodiments, contact 230B may be coupled to voltage reference 262. For example, voltage reference 262 may be a ground or a ground reference. For instance, voltage reference 262 may be a chassis ground of IHS 110.

In one or more embodiments, a power supply input of the second amplifier may be coupled to contact 220A. For example, contact 220A may be coupled to a contact 230A. For instance, contact 220A may be coupled to contact 230A via pressure. As an example, contact 220A may not be soldered or welded to contact 230A. In one or more embodiments, contact 230A may be coupled to pin 260. In one or more embodiments, contact 230A may be coupled to resistor 266. For example, resistor 266 may be coupled to positive voltage reference or positive voltage supply 264. For instance, the positive voltage reference or the positive voltage supply may be $V_{CC}$. As an example, positive voltage 264 may be a positive voltage reference or a positive voltage supply 264 of PCB 240. In one or more embodiments, resistor 266 may be a pull-up resistor. In one or more embodiments, resistor 266 may be a resistive load for the second amplifier. For example, resistor 266 may be a resistive load for transistor 272.

In one or more embodiments, voltage reference 252 may be coupled to a contact 220C. For example, voltage reference 252 may be a ground or a ground reference. For instance, voltage reference 252 may be a chassis ground of IHS 110. In one or more embodiments, contact 220C may be coupled to a contact 230C via pressure. For example, contact 220C may not be soldered or welded to contact 230C. In one or more embodiments, voltage reference 262 may be a ground or a ground reference. For instance, voltage reference 262 may be a chassis ground of IHS 110.

Figure 2G:
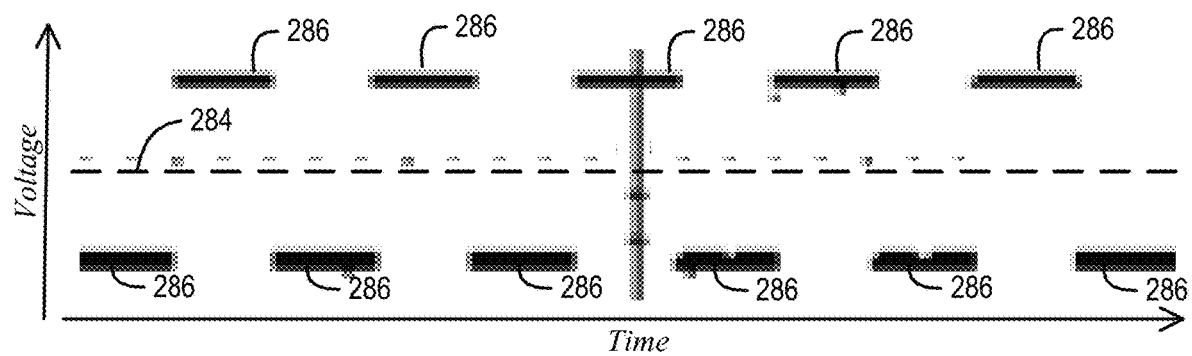
FIG. 2G illustrates example signals from a second fan circuit through at least one worn contact associated with contact resistance, according to one or more embodiments.

In one or more embodiments, signals from fan circuit 215 may be at pin 260. For example, as contact resistance increases between contacts 220B and 230B, signals from fan circuit 215 may be degraded at pin 260. For instance, example signals 282 from fan circuit 215 at pin 260 are shown in FIG. 2G. In one or more embodiments, when a signal 286 at pin 260 is below voltage threshold of 284, a logical zero may be indicated and/or inferred. For example, when contact resistance increases between conductors 220B and 230B, a signal 286 at pin 260 may be below voltage threshold of 284 if fan circuit 215 illustrated in FIG. 2D is utilized. For instance, a logical zero may be indicated and/or inferred when a signal 286 at pin 260 may be below or may be entirely below voltage threshold of 284 when signal 286 at pin 260 should be below voltage threshold of 284 if fan circuit 215 illustrated in FIG. 2D is utilized.

Figure 3:
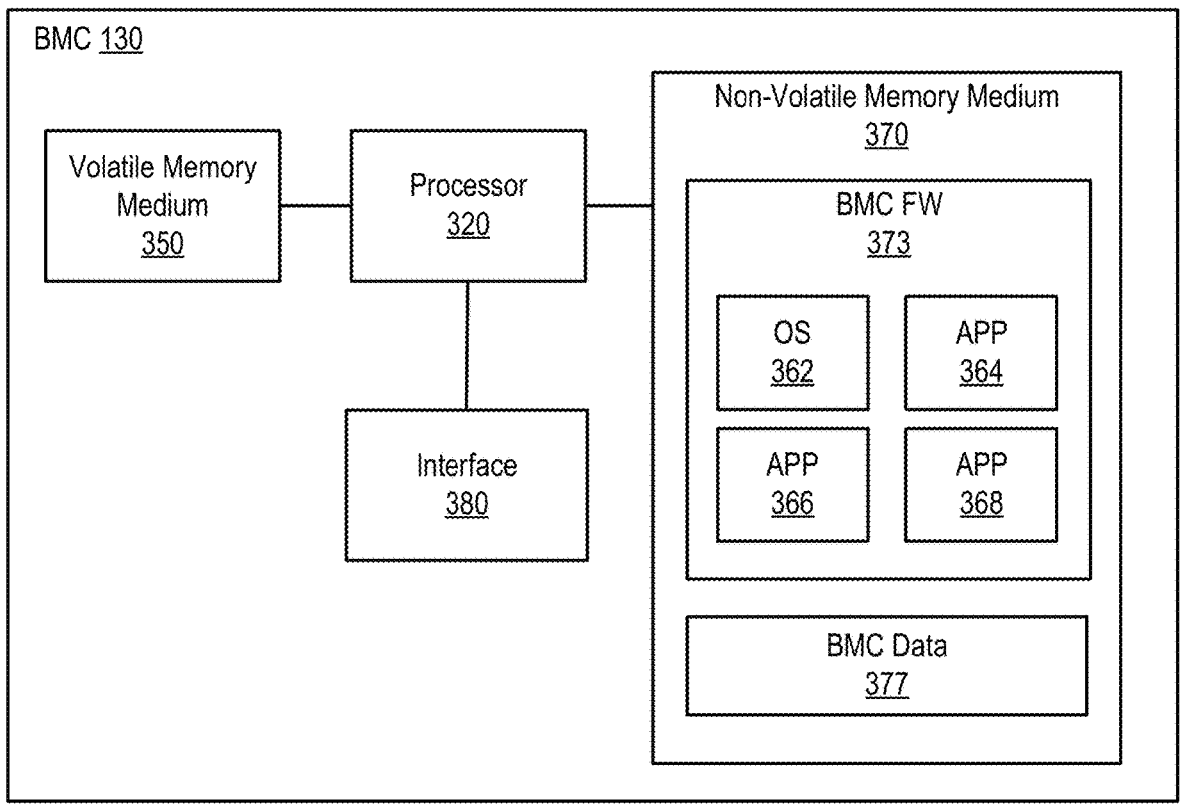
FIG. 3 illustrates an example of a baseboard management controller, according to one or more embodiments.

Turning now to FIG. 3, an example of a baseboard management controller is illustrated, according to one or more embodiments. As shown, BMC 130 may include a processor 320, a volatile memory medium 350, a non-volatile memory medium 370, and an interface 380. As illustrated, non-volatile memory medium 370 may include a BMC firmware (FW) 373, which may include an OS 362 and APPs 364-368, and may include BMC data 377. In one example, OS 362 may be or include a real-time operating system (RTOS). For instance, the RTOS may be or include FreeRTOS, OpenRTOS, SafeRTOS, QNX, ThreadX, VxWorks, NuttX, TI-RTOS, eCos, MicroC/OS, or Zephyr, among others. In a second example, OS 362 may be or include an Unix-like operating system. For instance, the Unix-like operating system may be or include LINUX®, FREEBSD®, NETBSD®, OpenBSD, Minix, Xinu, or Darwin, among others. In another example, OS 362 may be or include a portable operating system interface (POSIX) compliant operating system.

In one or more embodiments, interface 380 may include circuitry that enables communicatively coupling to one or more devices. In one example, interface 380 may include circuitry that enables communicatively coupling to one or more buses. For instance, the one or more buses may include one or more buses described herein, among others. In a second example, interface 380 may include circuitry that enables one or more interrupt signals to be received. In one instance, interface 380 may include general purpose input/output (GPIO) circuitry, and the GPIO circuitry may enable one or more interrupt signals to be received and/or provided via at least one interrupt line. In another instance, interface 380 may include GPIO circuitry that may enable BMC 130 to provide and/or receive signals associated with other circuitry (e.g., diagnostic circuitry, etc.). In a third example, interface 380 may include circuitry that enables communicatively coupling to one or more networks. In one instance, interface 380 may include circuitry that enables communicatively coupling to network interface 180. In another example, interface 380 may include a network interface.

In one or more embodiments, one or more of OS 362 and APPs 364-368 may include processor instructions executable by processor 320. In one example, processor 320 may execute processor instructions of one or more of OS 362 and APPs 364-368 via non-volatile memory medium 370. In another example, one or more portions of the processor instructions of the one or more of OS 362 and APPs 364-368 may be transferred to volatile memory medium 350, and processor 320 may execute the one or more portions of the processor instructions of the one or more of OS 362 and APPs 364-368 via volatile memory medium 350. In one or more embodiments, processor 320 may execute instructions in accordance with at least a portion of one or more systems, at least a portion of one or more flowcharts, one or more methods, and/or at least a portion of one or more processes described herein. For example, non-volatile memory medium 370 and/or volatile memory medium 350 may store instructions that may be executable in accordance with at least a portion of one or more systems, at least a portion of one or more flowcharts, at least a portion of one or more methods, and/or at least a portion of one or more processes described herein. In one or more embodiments, processor 320 may execute instructions in accordance with at least a portion of one or more of systems, flowcharts, at least a portion of one or more methods, and/or at least a portion of one or more processes described herein. For example, non-volatile memory medium 370 and/or volatile memory medium 350 may store instructions that may be executable in accordance with at least a portion of one or more of systems, at least a portion of one or more flowcharts, at least a portion of one or more methods, and/or at least a portion of one or more processes described herein. In one or more embodiments, processor 320 may utilize BMC data 377. In one example, processor 320 may utilize BMC data 377 via non-volatile memory medium 370. In another example, one or more portions of BMC data 377 may be transferred to volatile memory medium 350, and processor 320 may utilize BMC data 377 via volatile memory medium 350.

Figure 4:
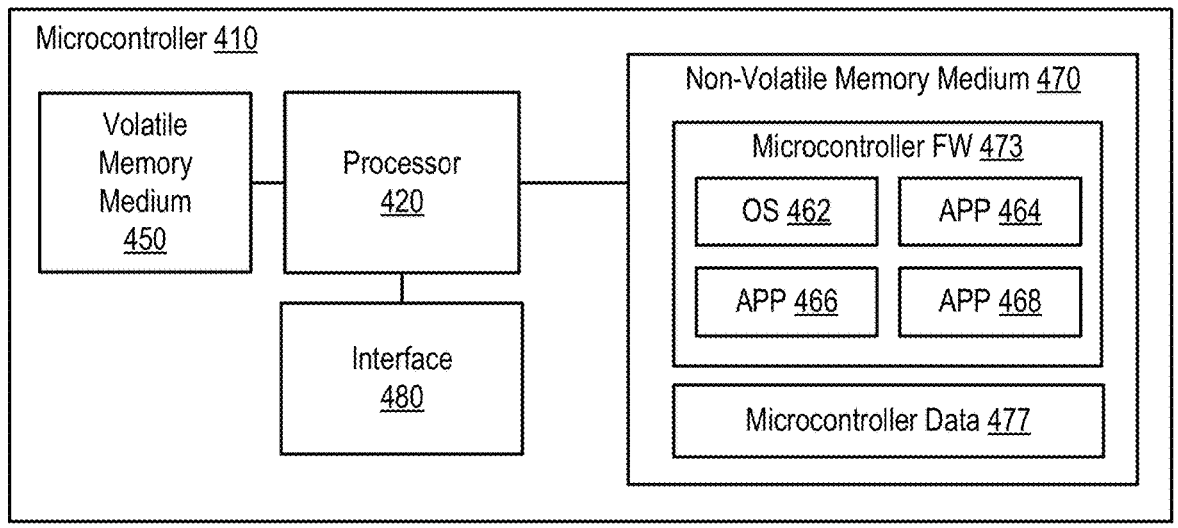
FIG. 4 illustrates an example of a microcontroller, according to one or more embodiments.

Turning now to FIG. 4, an example of a microcontroller is illustrated, according to one or more embodiments. In one or more embodiments, microcontroller 410 may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. As shown, microcontroller 410 may include a processor 420, a volatile memory medium 450, a non-volatile memory medium 470, and an interface 480. As illustrated, non-volatile memory medium 470 may include a microcontroller FW 473, which may include an OS 462 and APPs 464-468, and may include microcontroller data 477. In one example, OS 462 may be or include a real-time operating system (RTOS). For instance, the RTOS may be or include FreeRTOS, OpenRTOS, SafeRTOS, QNX, ThreadX, VxWorks, NuttX, TI-RTOS, eCos, MicroC/OS, or Zephyr, among others. In another example, OS 462 may be or include a POSIX compliant operating system.

In one or more embodiments, interface 480 may include circuitry that enables communicatively coupling to one or more devices. In one example, interface 480 may include circuitry that enables communicatively coupling to one or more buses. For instance, the one or more buses may include one or more buses described herein, among others. In a second example, interface 480 may include circuitry that enables one or more interrupt signals to be received. In one instance, interface 480 may include GPIO circuitry, and the GPIO circuitry may enable one or more interrupt signals to be received and/or provided via at least one interrupt line. In another instance, interface 480 may include GPIO circuitry that may enable microcontroller 410 to provide and/or receive signals associated with other circuitry. In a third example, interface 480 may include circuitry that enables communicatively coupling to one or more networks. In another example, interface 480 may include a network interface.

In one or more embodiments, one or more of OS 462 and APPs 464-468 may include processor instructions executable by processor 420. In one example, processor 420 may execute processor instructions of one or more of OS 462 and APPs 464-468 via non-volatile memory medium 470. In another example, one or more portions of the processor instructions of the one or more of OS 462 and APPs 464-468 may be transferred to volatile memory medium 450, and processor 420 may execute the one or more portions of the processor instructions of the one or more of OS 462 and APPs 464-468 via volatile memory medium 450. In one or more embodiments, processor 420 may execute instructions in accordance with at least a portion of one or more systems, at least a portion of one or more flowcharts, one or more methods, and/or at least a portion of one or more processes described herein. For example, non-volatile memory medium 470 and/or volatile memory medium 450 may store instructions that may be executable in accordance with at least a portion of one or more systems, at least a portion of one or more flowcharts, at least a portion of one or more methods, and/or at least a portion of one or more processes described herein. In one or more embodiments, processor 420 may execute instructions in accordance with at least a portion of one or more of systems, flowcharts, at least a portion of one or more methods, and/or at least a portion of one or more processes described herein. For example, non-volatile memory medium 470 and/or volatile memory medium 450 may store instructions that may be executable in accordance with at least a portion of one or more of systems, at least a portion of one or more flowcharts, at least a portion of one or more methods, and/or at least a portion of one or more processes described herein. In one or more embodiments, processor 420 may utilize microcontroller data 477. In one example, processor 420 may utilize microcontroller data 477 via non-volatile memory medium 470. In another example, one or more portions of microcontroller data 477 may be transferred to volatile memory medium 450, and processor 420 may utilize microcontroller data 477 via volatile memory medium 450.

Figure 5:
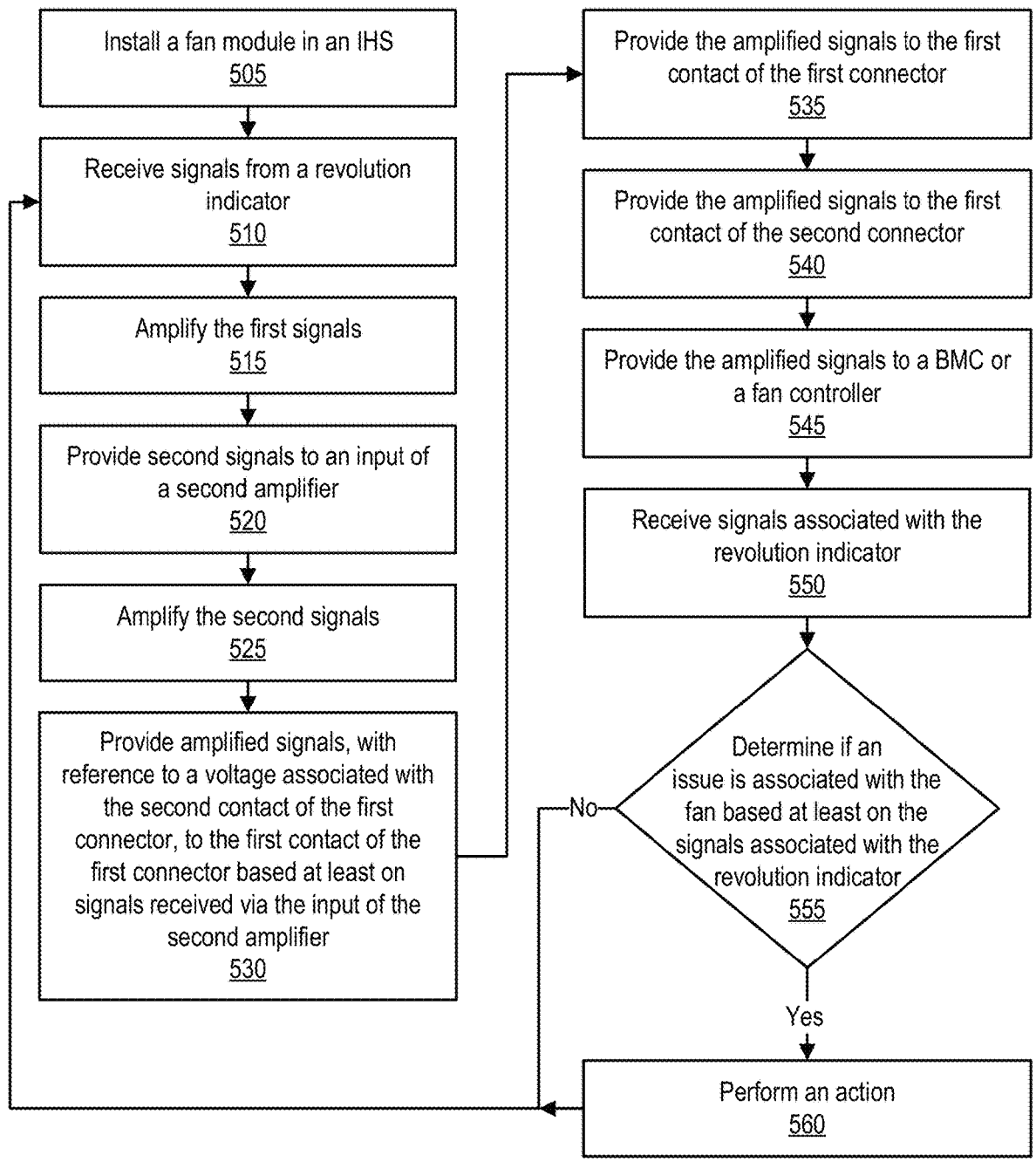
FIG. 5 illustrates an example of a method of utilizing a fan module, according to one or more embodiments.

Turning now to FIG. 5, an example of a method of utilizing a fan module is illustrated, according to one or more embodiments. At 505, a fan module may be installed in an information handling system. For example, a fan module 134 may be installed in an IHS 110. In one or more embodiments, installing the fan module in the information handling system may include coupling a first connector to a second connector. For example, installing fan module 134 in IHS 110 may include coupling a connector 225 to a connector 235. For instance, coupling connector 225 to connector 235 may include connecting connector 225 to connector 235. In one or more embodiments, coupling the first connector to the second connector may include coupling contacts of the first connector to respective contacts of the second connector. For example, contacts 220 of connector 225 may be respectively coupled to contacts 230 of connector 235. For instance, respectively coupling contacts 220 of connector 225 to contacts 230 of connector 235 may include respectively connecting contacts 220 of connector 225 to contacts 230 of connector 235.

In one or more embodiments, installing the fan module in the information handling system may include providing power to a fan of the fan module. For example, installing fan module 134 in IHS 110 may include providing power to a fan 132 of fan module 134. In one or more embodiments, the fan of the fan module may rotate, which may move air through the information handling system. For example, fan 132 of fan module 134 may rotate, which may move air through IHS 110. For instance, fan 132 of fan module 134 may rotate, which may move air through IHS 110 to remove heat from IHS 110.

At 510, an input of a first amplifier may receive first signals from a revolution indicator. For example, the first amplifier may receive first signals from a revolution indicator 212. For instance, the first signals from revolution indicator 212 may indicate complete revolutions of a fan 132 or multiple portions of complete revolutions of a fan 132. In one or more embodiments, the first amplifier may receive first signals from revolution indicator 212 via a pin 250. For example, the first amplifier may be or may include transistor 270. In one or more embodiments, the input of the first amplifier may be coupled to a first resistor and the revolution indicator. For example, the first resistor may be resistor 256. In one or more embodiments, the first resistor may be coupled to a positive voltage reference. For example, resistor 256 may be coupled to positive voltage supply 254. For instance, the positive voltage reference or the positive voltage supply may be $V_{CC}$.

At 515, the first signals may be amplified. For example, the first amplifier may amplify the first signals. For instance, transistor 270 may amplify the first signals. At 520, an output of the first amplifier may provide second signals to an input of a second amplifier. For example, the output of the first amplifier may be coupled to the input of the second amplifier. For instance, the second amplifier may be or may include transistor 272. In one or more embodiments, the second amplifier may receive the first signals. In one or more embodiments, the second signals may be amplifications of the first signals. In one or more embodiments, the output of the first amplifier may be coupled to a second resistor. For example, the second resistor may be resistor 274. For instance, resistor 274 may be a pull-down resistor.

In one or more embodiments, a power supply input of the second amplifier may be coupled to a first contact of the first connector. For example, the power supply input of the second amplifier may be coupled to contact 220A of connector 225. In one or more embodiments, an output of the second amplifier may be coupled to a second contact of the first connector. For example, the output of the second amplifier may be coupled to contact 220B of connector 225.

In one or more embodiments, the second resistor may be coupled to the second contact of the first connector. For example, resistor 274 may be coupled to contact 220B of connector 225. In one or more embodiments, the first contact of the first connector may be configured to be coupled to a first contact of the second connector. For example, contact 220A of connector 225 may be configured to be coupled to contact 230A of connector 235. In one or more embodiments, the first contact of the first connector may be configured to be coupled to the first contact of the second connector to drive a resistive load coupled to the first contact of the second connector. For example, the resistive load may be resistor 266. In one instance, resistor 266 may be coupled to contact 230A. In another instance, resistor 266 may be coupled to pin 260. As one example, pin 260 may be coupled to BMC 130. For instance, resistor 266 may be coupled to BMC 130. As another example, pin 260 may be coupled to fan controller 140. For instance, resistor 266 may be coupled to fan controller 140.

In one or more embodiments, resistor 266 positive voltage supply 264. For example, the positive voltage reference or the positive voltage supply may be $V_{CC}$. For instance, resistor 266 may be a pull-up resistor. In one or more embodiments, resistor 266 may be a resistive load for the second amplifier. For example, resistor 266 may be a resistive load for transistor 272. In one or more embodiments, the first contact of the first connector may be coupled to the first contact of the second connector to drive the resistive load coupled to the first contact of the second connector when the first connector is coupled to the second connector. For example, the first contact of the first connector may be coupled to the first contact of the second connector to drive the resistive load coupled to the first contact of the second connector when fan module 134 is installed in IHS 110.

In one or more embodiments, the second contact of the first connector may be configured to be coupled to a second contact of the second connector. For example, contact 220B may be configured to be coupled to contact 230B of connector 235. In one or more embodiments, the second contact of the first connector may be configured to be coupled to a second contact of the second connector to provide a reference voltage to the second amplifier. For example, the reference voltage may be voltage reference 262. In one or more embodiments, voltage reference 262 may be a ground or a ground reference. For example, voltage reference 262 may be a chassis ground of IHS 110.

At 525, the second amplifier may amplify the second signals. For example, transistor 272 may amplify the second signals. In one or more embodiments, the second amplifier may amplify the second signals with reference to a voltage associated with the second contact of the first connector. At 530, amplified signals, with reference to a voltage associated with the second contact of the first connector, may be provided to the first contact of the first connector based at least on signals received via the input of the second amplifier. For example, transistor 272 may provide amplified signals, with reference to a voltage associated with the second contact of the first connector, to the first contact of the first connector based at least on signals received via the input of the second amplifier. For instance, third signals may include the amplified signals, with reference to the voltage associated with the second contact of the first connector, to the first contact of the first connector based at least on signals received via the input of the second amplifier. As an example, the second amplifier may amplify the second signals to produce the third signals. For instance, transistor 272 may amplify the second signals to produce the third signals.

In one or more embodiments, an amplifier may be associated with a gain. In one example, a gain associated with an amplifier may be a unity value. In a second example, a gain associated with an amplifier may be greater than a unity value. In a third example, a gain associated with an amplifier may be less than a unity value. In another example, a gain associated with an amplifier may a negative value. For instance, the amplifier may be an inverting amplifier. As one example, the first amplifier may be configured to invert signals from the revolution indicator. As another example, the second amplifier may be configured to invert signals from the first amplifier.

In one or more embodiments, an amplifier may be utilized as an electronic switch. In one example, the first amplifier may be utilized as an electronic switch. In one instance, transistor 270 may be utilized as an electronic switch. In another instance, transistor 270 may implement an electronic switch. In another example, the second amplifier may be utilized as an electronic switch. In one instance, transistor 272 may be utilized as an electronic switch. In another instance, transistor 272 may implement an electronic switch.

In one or more embodiments, an electronic switch may not invert an input signal to an output signal. In one example, the first amplifier may be utilized as an electronic switch and may not invert an input signal to an output signal. In one instance, transistor 270 may be utilized as an electronic switch and may not invert an input signal to an output signal. In another instance, transistor 270 may implement an electronic switch and may not invert an input signal to an output signal. In another example, the second amplifier may be utilized as an electronic switch and may not invert an input signal to an output signal. In one instance, transistor 272 may be utilized as an electronic switch and may not invert an input signal to an output signal. In another instance, transistor 272 may implement an electronic switch and may not invert an input signal to an output signal.

In one or more embodiments, an electronic switch may invert an input signal to an output signal. In one example, the first amplifier may be utilized as an electronic switch and may invert an input signal to an output signal. In one instance, transistor 270 may be utilized as an electronic switch and may invert an input signal to an output signal. In another instance, transistor 270 may implement an electronic switch and may invert an input signal to an output signal. In another example, the second amplifier may be utilized as an electronic switch and may invert an input signal to an output signal. In one instance, transistor 272 may be utilized as an electronic switch and may invert an input signal to an output signal. In another instance, transistor 272 may implement an electronic switch and may invert an input signal to an output signal.

At 535, the amplified signals may be provided to the first contact of the first connector. For example, the third signals may be provided to contact 220A of connector 225. At 540, the amplified signals may be provided to the first contact of the second connector. For example, the third signals may be provided to contact 230A of connector 235. For instance, contact 220A of connector 225 may provide the third signals to contact 230A of connector 235. At 545, the amplified signals may be provided to a BMC or a fan controller. For example, the third signals may be provided to BMC 130 or fan controller 140.

At 550, signals associated with the revolution indicator may be received. In one example, BMC 130 may receive signals associated with revolution indicator 212. For instance, BMC 130 may receive signals associated with revolution indicator 212 via pin 260. In another example, fan controller 140 may receive signals associated with revolution indicator 212. For instance, fan controller 140 may receive signals associated with revolution indicator 212 via pin 260. In one or more embodiments, the receive signals associated with the revolution indicator may be fourth signals. For example, the fourth signals may be received from the second amplifier. For instance, the fourth signals may be received via the first contact of the second connector.

As an example, the fourth signals may be received via contact 230A of connector 235.

At 555, it may be determined if an issue is associated with the fan based at least on the signals associated with the revolution indicator. In one example, BMC 130 may determine if an issue is associated with fan 132 based at least on the signals associated with revolution indicator 212. For instance, BMC 130 may determine if an issue is associated with fan 132 based at least on the signals associated with revolution indicator 212 via pin 260. In another example, fan controller 140 may determine if an issue is associated with fan 132 based at least on the signals associated with revolution indicator 212. For instance, fan controller 140 may determine if an issue is associated with fan 132 based at least on the signals associated with revolution indicator 212 via pin 260.

If there is the issue associated with the fan based at least on the signals associated with the revolution indicator, an action may be performed, at 560. In one example, BMC 130 may perform the action. In another example, fan controller 140 may perform the action. In one or more embodiments, the action may include one or more of logging the issue associated with the fan, providing information associated with the issue associated with the fan, and providing an alert associated with the issue associated with the fan, among others. For example, one or more of providing information associated with the issue associated with the fan and providing an alert associated with the issue associated with the fan may include one or more of providing the information associated with the issue associated with the fan to another information handling system or an administrator and providing the alert associated with the issue associated with the fan to another information handling system or an administrator. In one or more embodiments, the method may proceed to 510, according to one or more embodiments. If there is not the issue associated with the fan based at least on the signals associated with the revolution indicator, the method may proceed to 510, according to one or more embodiments.

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with at least a portion of one or more flowcharts, at least a portion of one or more systems, at least a portion of one or more methods, and/or at least a portion of one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
   at least one processor;
   a memory medium, coupled to the at least one processor, that stores instructions executable by the at least one processor;
   a fan;
   a revolution indicator configured to provide signals associated with revolutions of the fan; and
   a fan circuit, communicatively coupled to the revolution indicator, comprising:
     a plurality of amplifiers; and
     a plurality of resistors;
   wherein an input of a first amplifier of the plurality of amplifiers is coupled to a first resistor of the plurality of resistors and the revolution indicator;
   wherein the first resistor is coupled to a positive voltage reference;
   wherein an output of the first amplifier is coupled to an input of a second amplifier of the plurality of amplifiers and a second resistor of the plurality of resistors;
   wherein a power supply input of the second amplifier is coupled to a first contact of a first connector and an output of the second amplifier is coupled to a second contact of the first connector;
   wherein the first contact of the first connector is configured to be coupled to a first contact of a second connector to drive a resistive load coupled to the first contact of the second connector;
   wherein the second contact of the first connector is configured to be coupled to a second contact of the second connector to provide a reference voltage to the second amplifier; and
   wherein the second amplifier is configured to provide amplified signals, with reference to a voltage associated with the second contact of the first connector, to the first contact of the first connector based at least on signals received via the input of the second amplifier.

2. The information handling system of claim 1, wherein a single semiconductor substrate includes the first amplifier and the second amplifier.

3. The information handling system of claim 1, wherein the second amplifier is configured to invert signals from the first amplifier.

4. The information handling system of claim 1, wherein the signals from the revolution indicator indicate complete revolutions of the fan or multiple portions of the complete revolutions of the fan.

5. The information handling system of claim 1, wherein the first amplifier includes a first transistor and the second amplifier includes a second transistor.

6. The information handling system of claim 5,
   wherein the first transistor includes a first bipolar junction transistor or a first field-effect transistor; and
   wherein the second transistor includes a second bipolar junction transistor or a second field-effect transistor.

7. The information handling system of claim 6,
   wherein the first field-effect transistor includes a first metal-oxide-semiconductor field effect transistor or a first junction field effect transistor; and
   wherein the second field-effect transistor includes a second metal-oxide-semiconductor field-effect transistor or a second junction field-effect transistor.

8. A fan module, comprising:
   a fan;

a revolution indicator configured to provide signals associated with revolutions of the fan; and
a fan circuit, communicatively coupled to the revolution indicator, comprising:
a plurality of amplifiers; and
a plurality of resistors;
wherein an input of a first amplifier of the plurality of amplifiers is coupled to a first resistor of the plurality of resistors and the revolution indicator;
wherein the first resistor is coupled to a positive voltage reference;
wherein an output of the first amplifier is coupled to an input of a second amplifier of the plurality of amplifiers and a second resistor of the plurality of resistors;
wherein a power supply input of the second amplifier is coupled to a first contact of a first connector and an output of the second amplifier is coupled to a second contact of the first connector;
wherein the first contact of the first connector is configured to be coupled to a first contact of a second connector to drive a resistive load coupled to the first contact of the second connector;
wherein the second contact of the first connector is configured to be coupled to a second contact of the second connector to provide a reference voltage to the second amplifier; and
wherein the second amplifier is configured to provide amplified signals, with reference to a voltage associated with the second contact of the first connector, to the first contact of the first connector based at least on signals received via the input of the second amplifier.

9. The fan module of claim 8, wherein the fan circuit includes a single semiconductor substrate that includes the first amplifier and the second amplifier.

10. The fan module of claim 8, wherein the second amplifier is configured to invert signals from the first amplifier.

11. The fan module of claim 8, wherein the signals from the revolution indicator indicate complete revolutions of the fan or multiple portions of the complete revolutions of the fan.

12. The fan module of claim 8, wherein the first amplifier includes a first transistor and the second amplifier includes a second transistor.

13. The fan module of claim 12,
wherein the first transistor includes a first bipolar junction transistor or a first field-effect transistor; and
wherein the second transistor includes a second bipolar junction transistor or a second field-effect transistor.

14. The fan module of claim 13,
wherein the first field-effect transistor includes a first metal-oxide-semiconductor field effect transistor or a first junction field effect transistor; and
wherein the second field-effect transistor includes a second metal-oxide-semiconductor field-effect transistor or a second junction field-effect transistor.

15. A fan circuit, comprising:
a plurality of amplifiers; and
a plurality of resistors;
wherein an input of a first amplifier of the plurality of amplifiers is coupled to a first resistor of the plurality of resistors and a revolution indicator configured to provide signals associated with revolutions of a fan;
wherein the first resistor is coupled to a positive voltage reference;
wherein an output of the first amplifier is coupled to an input of a second amplifier of the plurality of amplifiers and a second resistor of the plurality of resistors;
wherein a power supply input of the second amplifier is coupled to a first contact of a first connector and an output of the second amplifier is coupled to a second contact of the first connector;
wherein the first contact of the first connector is configured to be coupled to a first contact of a second connector to drive a resistive load coupled to the first contact of the second connector;
wherein the second contact of the first connector is configured to be coupled to a second contact of the second connector to provide a reference voltage to the second amplifier; and
wherein the second amplifier is configured to provide amplified signals, with reference to a voltage associated with the second contact of the first connector, to the first contact of the first connector based at least on signals received via the input of the second amplifier.

16. The fan circuit of claim 15, further comprising:
a single semiconductor substrate that includes the first amplifier and the second amplifier.

17. The fan circuit of claim 15, wherein the second amplifier is configured to invert signals from the first amplifier.

18. The fan circuit of claim 15, wherein the signals from the revolution indicator indicate complete revolutions of the fan or multiple portions of the complete revolutions of the fan.

19. The fan circuit of claim 15, wherein the first amplifier includes a first transistor and the second amplifier includes a second transistor.

20. The fan circuit of claim 19,
wherein the first transistor includes a first bipolar junction transistor or a first field-effect transistor; and
wherein the second transistor includes a second bipolar junction transistor or a second field-effect transistor.

* * * * *